United States Patent
Chen et al.

(10) Patent No.: US 7,563,563 B2
(45) Date of Patent: Jul. 21, 2009

(54) WET DEVELOPABLE BOTTOM ANTIREFLECTIVE COATING COMPOSITION AND METHOD FOR USE THEREOF

(75) Inventors: Kuang-Jung J. Chen, Poughkeepsie, NY (US); Mahmoud Khojasteh, Poughkeepsie, NY (US); Ranee Wai-Ling Kwong, Wappingers Falls, NY (US); Margaret C. Lawson, LaGrangeville, NY (US); Wenjie Li, Poughkeepsie, NY (US); Kaushal S. Patel, Wappingers Falls, NY (US); Pushkara R. Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 11/405,879

(22) Filed: Apr. 18, 2006

(65) Prior Publication Data

US 2007/0243484 A1    Oct. 18, 2007

(51) Int. Cl.
*G03C 1/825*   (2006.01)
*G03F 7/039*   (2006.01)
*G03F 7/20*    (2006.01)
*G03F 7/30*    (2006.01)
*G03F 7/36*    (2006.01)

(52) U.S. Cl. .................. 430/326; 430/313; 430/317; 430/323; 430/327; 430/330; 430/331; 430/271.1

(58) Field of Classification Search .............. None
See application file for complete search history.

(56) References Cited

U.S. PATENT DOCUMENTS

| 5,939,236 | A | 8/1999 | Pavelchek et al. |
| 6,261,743 | B1 | 7/2001 | Pavelchek et al. |
| 6,503,689 | B2 | 1/2003 | Zampini et al. |
| 6,610,457 | B2 | 8/2003 | Kim et al. |
| 6,770,419 | B2 | 8/2004 | Khojasteh et al. |
| 6,806,026 | B2 | 10/2004 | Allen et al. |
| 2003/0129531 | A1 | 7/2003 | Oberlander et al. |
| 2003/0166828 | A1 | 9/2003 | Cox et al. |
| 2003/0215736 | A1 | 11/2003 | Oberlander et al. |
| 2004/0210034 | A1 | 10/2004 | Cox et al. |
| 2004/0229166 | A1 | 11/2004 | Rushkin et al. |
| 2004/0241579 | A1 | 12/2004 | Hamada et al. |
| 2005/0153232 | A1 | 7/2005 | Li et al. |
| 2005/0214674 | A1* | 9/2005 | Sui et al. ............. 430/270.1 |
| 2005/0227167 | A1 | 10/2005 | Li et al. |
| 2007/0231736 | A1* | 10/2007 | Chen et al. ............. 430/270.1 |

* cited by examiner

*Primary Examiner*—Sin J. Lee
(74) *Attorney, Agent, or Firm*—Scully, Scott, Murphy & Presser, P.C.; Steven Capella, Esq.

(57) ABSTRACT

The present invention discloses an antireflective coating composition for applying between a substrate surface and a positive photoresist composition. The antireflective coating composition is developable in an aqueous alkaline developer. The antireflective coating composition comprises a polymer, which comprises at least one monomer unit containing one or more moieties selected from the group consisting of a lactone, maleimide, and an N-alkyl maleimide; and at least one monomer unit containing one or more absorbing moieties. The polymer does not comprise an acid labile group. The present invention also discloses a method of forming and transferring a relief image by using the inventive antireflective coating composition in photolithography.

1 Claim, 1 Drawing Sheet

WET DEVELOPABLE BOTTOM ANTIREFLECTIVE COATING COMPOSITION AND METHOD FOR USE THEREOF

FIELD OF THE INVENTION

This invention relates to an antireflective coating composition for use with an overlying positive photoresist. More particularly, this invention is directed to a positive working bottom antireflective coating composition that is developable in an aqueous alkaline developer. The present invention also relates to a method for forming and transferring a relief image by using the inventive antireflective coating composition in photolithography.

BACKGROUND OF THE INVENTION

In a photolithography process, exposure of a photoresist to activating radiation is an important step in attaining a high resolution photoresist image. However, reflection of activating radiation from the photoresist and the underlying substrate substantially limits the resolution of a lithography process. Two major problems of reflected radiation are: (1) thin film interference effects or standing waves, which are caused by variations in the total light intensity in the photoresist film as the photoresist thickness changes; and (2) reflective notching, which occurs when the photoresist is patterned over substrates containing topographical features.

As semiconductor manufactures have sought to fabricate devices having a higher degree of circuit integration to improve device performance, it has become necessary to use photolithographic techniques using shorter wavelengths (300 nm or less in wavelength) in the deep and extreme ultraviolet (UV) spectra to achieve fine features. The use of shortened wavelengths of light for imaging a photoresist coating has resulted in increased reflection from the upper resist surface as well as the surface of the underlying substrate.

To reduce the problem of reflected radiation, prior art processes typically use a radiation-absorbing layer interposed between the substrate surface and the photoresist coating layer. Such an antireflective layer is also referred to as a bottom antireflective coating, i.e., BARC. Although BARC materials may effectively reduce the back reflection of activating radiation, removal of BARC materials without adversely interfering with the overlying photoresist and/or the underlying substrate proves to be challenging.

Most prior art BARC materials are designed to be removed by a plasma etch process (see, for example, U.S. Pat. Nos. 5,939,236, 6,503,689, 6,610,457, and 6,261,743). Plasma etching refers to the removal of material, typically a masked pattern of semiconductor material, by exposing the material to a plasma of chlorine- or fluorine-based etchants, which dislodges portions of the material from the exposed surface. Plasma etch processes often cause thinning of a photoresist layer. Thus, if the etch rate of the BARC materials and the photoresist layer is not well matched, the pattern in the photoresist layer may be damaged or not be transferred properly to the substrate. Plasma etch processes may also cause damage to the substrate thereby affecting the performance of the final device. Furthermore, the additional step of removing BARC materials increases cost and operational complexity in photolithography.

Other prior art BARC materials include wet developable BARC materials. For example, U.S. Patent Application Publication Nos. 2003/0166828 and 2004/0210034 disclose BARC materials based on polyamic acids. This type of BARC materials has to be baked at a certain temperature range to partially covert the polyamic acids into polyimides to obtain the desired dissolution properties. The required bake temperature window can be narrow (<10° C.) and difficult to be effectively controlled. Moreover, exposed and unexposed areas of this type of BARC materials have the same dissolution rate in an alkaline developer, often causing an undercut of the photoresist lines. U.S. Patent Application Publication No. 2003/0129531 describes a positive photoimaginable BARC material based on a polymer comprising at least one unit with an acid labile group. This type of BARC materials requires the BARC material and the overlying photoresist have matching photospeeds. U.S. Patent Application Publication No. 2003/0215736 describes a negative photoimaginable BARC material based on a polymer which undergoes crosslinking upon light exposure to obtain the desired dissolution property. However, the acid residues generated in the crosslinking process may diffuse to the photoresist/BARC interface causing adverse effects, such as footing in a negative photoresist.

Thus, there remains a need for an antireflective coating composition that is developable in an aqueous alkaline developer, compatible with the overlying photoresist, and has desired optical properties so that it can also be used as a BARC in short wavelength photolithography.

SUMMARY OF THE INVENTION

Accordingly, the present invention provides an antireflective coating composition for applying between a substrate surface and a positive photoresist composition. The antireflective coating composition is developable in an aqueous alkaline developer. The antireflective coating composition comprises a polymer which comprises at least one monomer unit containing one or more moieties selected from the group consisting of a lactone, maleimide, and an N-alkyl maleimide; and at least one monomer unit containing one or more absorbing moieties. The polymer does not comprise an acid labile group. It is preferred that the inventive antireflective coating composition further comprises at least one photo sensitive additive.

The present invention also provides an antireflective coating composition for applying between a substrate surface and a positive photoresist layer. The antireflective coating composition is developable in an aqueous alkaline developer. The antireflective coating composition of the present invention comprises a polymer which has a dissolution rate of about 0.5 to about 50 nm per second in a tetramethyl ammonium hydroxide (TMAH) aqueous developer having a concentration from about 0.2 to about 0.3 N at a temperature in the range from about 0° to about 60° C. and does not comprise an acid labile group. It is preferred that the inventive antireflective coating composition further comprises at least one photo sensitive additive.

The present invention also provides a method of forming and transferring a relief image by photolithography. The method comprises the steps of: applying, to a substrate, a layer of the inventive antireflective coating composition to form an antireflective layer; applying a layer of a positive photoresist composition over the antireflective layer to form a photoresist layer; pattern-wise exposing the photoresist layer and the antireflective layer to an imaging radiation to form a latent image; contacting the photoresist layer and the antireflective layer with the aqueous alkaline developer, wherein the exposed portions of the photoresist layer and the exposed portions of the antireflective layer are removed to form a patterned photoresist layer and a patterned antireflective layer having a relief image pattern therein; and transferring the relief image pattern in the patterned photoresist layer and the patterned antireflective layer to the substrate.

DETAILED DESCRIPTION OF THE INVENTION

As stated above, the present invention is directed to an antireflective coating composition for applying between a substrate surface and a positive photoresist composition. The positive photoresist composition may be either a non-silicon-containing resist or a silicon-containing resist. The antireflective coating composition of the present invention is positive working and is developable in an aqueous alkaline developer. The inventive antireflective coating composition comprises a polymer which has a dissolution rate of about 0.5 to about 50 nm per second in a tetramethyl ammonium hydroxide (TMAH) aqueous developer having a concentration from about 0.2 to about 0.3 N and does not comprise an acid labile group. It is more preferred that the polymer has a dissolution rate of about 1 to about 30 nm per second in 0.263 N tetramethyl ammonium hydroxide (TMAH) aqueous developer. The above-mentioned dissolution rates refer to dissolution rate at a temperature in the range from about 0° to about 60° C. with the range from about 20° to about 25° C. more preferred. By "positive", it is meant that portions of the photoresist layer that are exposed to an imaging radiation are more soluble in a developer than unexposed portions thereof. By "positive working", it is meant that portions of the antireflective layer that are exposed to an imaging radiation have an equal or faster dissolution rate in a developer than unexposed portions thereof. The term "an acid labile group" as used herein denotes any chemical moiety that readily undergoes deprotection reaction in the presence of acids. Examples of an acid labile group include, but are not limited to: a tertiary alkyl carbonate, a tertiary alkyl ester, a tertiary alkyl ether, an acetal and a ketal. Preferably, the polymer of the present invention comprises at least one monomer unit containing one or more moieties selected from the group consisting of a lactone, maleimide, and an N-alkyl maleimide, and at least one monomer unit containing one or more absorbing moieties. It should be noted that the inventive antireflective coating can also be referred to as a BARC.

The present invention is also directed to an antireflective coating composition for applying between a substrate surface and a positive photoresist composition. The antireflective coating composition is positive working and developable in an aqueous alkaline developer. The antireflective coating composition comprises a polymer which comprises at least one monomer unit containing one or more moieties selected from the group consisting of a lactone, maleimide, and an N-alkyl maleimide; and at least one monomer unit containing one or more absorbing moieties. The polymer does not comprise an acid labile group. It is preferred that the polymer has a dissolution rate of about 0.5 to about 50 nm per second in a tetramethyl ammonium hydroxide (TMAH) aqueous developer having a concentration from about 0.2 to about 0.3 N. It is more preferred that the polymer has a dissolution rate of about 1 to about 30 nm per second in 0.263 N tetramethyl ammonium hydroxide (TMAH) aqueous developer. The above-mentioned dissolution rates refer to dissolution rate at a temperature in the range from about 0° to about 60° C. with the range from about 20° to about 25° C. more preferred. The terms "positive", "positive working", and "an acid labile group" are defined the same as described above.

The term "lactone" as used herein denotes a cyclic ester, which is the condensation product of an alcohol group and a carboxylic acid group in the same molecule. The lactone moiety suitable for the present invention may be monocyclic or polycyclic. The rings in the polycyclic lactone moiety may be fused or non-fused. Preferably, the lactone moiety is a beta-lactone, a gamma-lactone, or a delta-lactone. It is understood by one skilled in the art that the prefixes, such as beta, gamma, and delta, indicate the ring size of a lactone. That is, a beta-lactone, a gamma-lactone, and a delta-lactone denote a 4-membered, a 5-membered, and a 6-membered lactone ring, respectively. Examples of lactone moieties suitable for the present invention include, but are not limited to: beta-propiolactone, gamma-butyrolactone, 2,6-norbornane-gamma-carbolactone, and 2,6-norbornane-delta-carbolactone. The lactone moiety of the present invention may be further substituted by other chemical groups, such as an alkyl group having 1 to 6 carbon atoms, an alkenyl group having 2 to 6 carbon atoms, an alkynyl group having 2 to 6 carbon atoms, halogen, hydroxyl, cyano, nitro, and an alkoxyl having 1 to 6 carbon atoms.

In exemplary embodiments of the present invention, the at least one monomer unit containing one or more moieties selected from the group consisting of a lactone, maleimide, and an N-alkyl maleimide may include, but is not limited to:

-continued (VI)

(VII)

(VIII)

(IX)

(V)

(X)

(XI)

wherein R is a hydrogen atom or an alkyl group having 1 to 10 carbon atoms. The alkyl group having 1 to 10 carbon atoms may be straight, branched, or cyclic. Examples of alkyl groups suitable for the present invention include, but are not limited to: methyl, ethyl, n-propyl, iso-propyl, n-butyl, n-pentyl, cyclopentyl, hexyl, and cyclohexyl.

The one or more absorbing moieties employed in the present invention may be any chemical moiety that absorbs radiation at the exposure wavelength. Preferably, the one or more absorbing moieties include, but are not limited to, acidic absorbing moieties selected from: a hydroxy-substituted hydrocarbon aromatic moiety, a hydroxy-substituted heterocyclic aromatic moiety, a fluoroalcohol-substituted hydrocarbon aromatic moiety, a fluoroalcohol-substituted heterocyclic aromatic moiety, or a mixture thereof.

The term "aromatic moiety" as used herein denotes an organic radical derived from an aromatic compound by the removal of one hydrogen atom. The term "an aromatic compound" as used herein denotes an organic compound characterized by increased chemical stability resulting from the debealization of electrons in one or more rings containing usually multiple conjugated double bonds. The aromatic moiety of the present invention may be hydrocarbon or heterocyclic. By "hydrocarbon aromatic moiety", it is meant an aromatic moiety containing only hydrogen atoms and carbon atoms. By "heterocyclic aromatic moiety", it is meant an aromatic moiety containing one or more heteroatoms selected from nitrogen, oxygen, sulfur, or a combination thereof in the aromatic ring(s). The aromatic moiety may be monocyclic or polycyclic. The rings in the polycyclic aromatic moiety may be fused or non-fused. By "hydroxy substituted", it is meant at least one of the carbon atoms in the aromatic ring(s) is substituted with a hydroxy group. Examples of the hydroxy-substituted hydrocarbon aromatic moiety suitable for the present invention include, but are not limited to: hydroxy-substituted benzene, toluene, xylene, naphthalene, indene, pentalene, fluorene, and phenalene. Examples of the hydroxy-substituted heterocyclic aromatic moiety include, but are not limited to: hydroxy-substituted furan, benzofuran, pyrrole, pyridine, pyrazole, imidazole, and thiophene.

The term "fluoroalcohol" as used herein denotes an organic radical having the following structure:

(XII)

wherein $R_1$ represents hydrogen, methyl, trifluoromethyl, difluoromethyl, fluoromethyl, or a semi- or perfluorinated alkyl group having 2-6 carbon atoms; where $R_2$ represents trifluoromethyl, difluoromethyl, fluoromethyl, or a semi- or perfluorinated alkyl group having 2-6 carbon atoms. Examples of the fluoroalcohols suitable for the present invention include, but are not limited to: hexafluoroisopropanol, trifluoroisopropanol, and trifluoroethanol. It should be understood by one skilled in the art that the fluoroalcohol of formula (XII) of the present invention is covalently bonded to a hydrocarbon aromatic moiety or a heterocyclic aromatic moiety through the bond crossed by a dotted line.

In the present invention, the hydroxy-substituted hydrocarbon aromatic moiety, the hydroxy-substituted heterocyclic aromatic moiety, the fluoroalcohol-substituted hydrocarbon aromatic moiety, and the fluoroalcohol-substituted heterocyclic aromatic moiety may be further substituted by other chemical groups that include, but are not limited to: an alkyl group having 1 to 6 carbon atoms, an alkenyl group having 2 to 6 carbon atoms, an alkynyl group having 2 to 6 carbon atoms, halogen, hydroxyl, cyano, nitro, and an alkoxyl having 1 to 6 carbon atoms.

Preferably, the hydroxy-substituted hydrocarbon aromatic moiety of the present invention is selected from substituted and unsubstituted phenol, and substituted and unsubstituted naphthol; and the fluoroalcohol-substituted hydrocarbon aromatic moiety is selected from substituted and unsubstituted phenyl hexafluoroisopropanol, and substituted and unsubstituted naphthyl hexafluoroisopropanol.

In the present invention, the one or more absorbing moieties and the one or more moieties selected from the group consisting of a lactone, maleimide, and an N-alkyl maleimide may be on the same or different monomer units. In other words, the inventive polymer may comprise at least one monomer unit containing one or more absorbing moieties and one or more moieties selected from the group consisting of a lactone, maleimide, and an N-alkyl maleimide, or the inventive polymer may comprise at least one monomer unit containing one or more absorbing moieties and at least one co-monomer unit containing one or more moieties selected from the group consisting of a lactone, maleimide, and an N-alkyl maleimide.

The dissolution rate of the inventive polymer in an aqueous alkaline developer may be adjusted by varying the molar ratio of the at least one monomer unit containing one or more moieties selected from the group consisting of a lactone, maleimide, and an N-alkyl maleimide, and the at least one co-monomer unit containing one or more acidic absorbing moieties. For example, the molar ratio of the above monomer unit and co-monomer unit can be adjusted such that the inventive polymer has a dissolution rate of about 0.2 to about 100 nm per second in a tetramethyl ammonium hydroxide (TMAH) aqueous developer having a concentration of about 0.2 to about 0.3 N. Preferably, the inventive polymer has a dissolution rate of about 0.5 to about 50 nm per second in a tetramethyl ammonium hydroxide (TMAH) aqueous developer having a concentration from about 0.2 to about 0.3 N. More preferably, the inventive polymer has a dissolution rate of about 1 to about 30 nm per second in 0.263 N tetramethyl ammonium hydroxide (TMAH) aqueous developer. The above-mentioned dissolution rates refer to dissolution rate at a temperature in the range from about 0° to about 60° C. with the range from about 20° to about 25° C. more preferred.

In a preferred embodiment of the present invention, the polymer comprises the following structure:

(XIII)

(XIV)

(XV)

(XVI)

(XVII)

wherein x, y, and z are the same or different, and are independently an integer of 5-500.

It is also preferable that the inventive polymer has a tunable polymer molecular weight a weight average molecular weight ranging from about 3K to about 500K Daltons to enable the formulation of high solid content spin castable solutions with adequate viscosity. More preferably, the weight average molecular weight of the inventive polymer ranges from about 5K to about 200K Daltons. The resistance of the inventive antireflective coating composition to photoresist casting solvents improves upon increasing the polymer molecular weight. Additional co-monomers can also be added as described to prepare copolymer materials with improved mechanical durability and/or to adjust the refractive index of the coating.

It is preferred that the inventive antireflective coating composition further comprises at least one photo sensitive additive. The at least one photo sensitive additive may be any compound that can readily transform to an organic acid when exposed to an ultraviolet radiation. By "organic acid", it is meant an organic compound having an acid group covalently attached to the carbon backbone thereof. Examples of organic acids include, but are not limited to: carboxylic acids and sulfonic acids. Depending on the intended use and the desired performance, the inventive antireflective coating composition may comprise up to 20% by weight of the at least one photo sensitive additive.

Preferably, the photo sensitive additive in the inventive antireflective coating composition is a photo acid generator or a diazoquinone derivative. A "photo acid generator", also known as PAG, is a compound that generates an acid molecule upon illumination. In the present invention, it is preferred that the photo acid generator is an onium salt. The onium salts suitable for the present invention include, but are not limited to: iodonium salts, sulfonium salts, or a mixture thereof. Examples of the onium salts suitable for the present invention include, but are not limited to: di(4-t-tutylphenyl) iodonium camphorsulfonate, di(4-t-tutylphenyl)iodonium triflate, triphenylsulfonium camphorsulfonate, triphenylsulfonium triflate, 4-(1-butoxynaphthyl) tetrahydrothiophenium perfluorobutanesulfonate, triphenylsulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, and di(t-butylphenyl) iodonium perfluoroethylcyclohexane sulfonate. As used herein, the "diazoquinone derivative" denotes a compound containing at least one diazoquinone moiety. Examples of the diazoquinone derivative suitable for the present invention include, but are not limited to, compounds having the following structure or a derivative thereof:

(XXIX)

where $X_1$, $X_2$, and $X_3$ are the same or differently, and are selected from a chemical group having one of the following structures:

(XXX)

and (XXXI)

It should be understood by one skilled in the art that the chemical group of formula (XXX) or formula (XXXI) of the present invention is covalently bonded to the phenyl ring in formula (XXIX) through the bond crossed by a dotted line.

The at least one photo sensitive additive decreases or inhibits dissolution of the inventive antireflective coating composition in an aqueous alkaline developer. Thus, the dissolution rate of the inventive antireflective coating composition with the at least one photo sensitive additive in an aqueous alkaline developer is lower than that of the inventive antireflective coating composition without the at least one photo sensitive additive. However, the dissolution rate of the inventive antireflective coating composition with the at least one photo sensitive additive in an aqueous alkaline developer increases upon exposure to an ultraviolet radiation. Therefore, after pattern-wise exposure to an ultraviolet radiation, the dissolution rate of exposed portions of the inventive antireflective coating composition with the at least one photo sensitive additive in an aqueous alkaline developer is higher than that of unexposed portions of the same. That is, the at least one photo sensitive additive imparts the property of anisotropic dissolution to the inventive antireflective coating composition.

It is preferred that the inventive antireflective coating composition may contain about 2 to about 30 weight % of the at least one photo sensitive additive, based on the total weight of the polymer. More preferably, the inventive antireflective coating composition may contain about 5 to about 20 weight % of the at least one photo sensitive additive, based on the total weight of the polymer.

It is also preferred that the inventive antireflective coating composition further comprises at least one surfactant. The surfactants that can be employed in the invention are those that are capable of improving the coating homogeneity of the inventive antireflective coating composition. Illustrative examples of such surfactants include, but are not limited to: fluorine-containing surfactants such as 3M's FC-430® and the like, siloxane-containing surfactants such as Union Carbide's SILWET® series and the like, or a mixture thereof.

It is preferred that the inventive antireflective coating composition may contain about 10 to about 500 ppm of the at least one surfactant, based on the total weight of the polymer. More preferably, the inventive antireflective coating composition may contain about 50 to about 300 ppm of the at least one surfactant, based on the total weight of the polymer.

It is preferred that the inventive antireflective coating composition is soluble in organic solvents that include, but are not limited to: a ketone, a lactone, and a combination thereof. Thus, the inventive antireflective coating composition can be cast in these organic solvents. By "soluble" it is meant having a solubility of at least 10 mg per milliliter in a solvent at a designated temperature. Preferably, the ketone includes, but is not limited to: a cyclic ketone. Examples of the cyclic ketone solvents suitable for the present invention include, but are not limited to: cyclohexanone and cyclopentaone. Examples of the lactone suitable for the present invention include, but are not limited to: gamma-butyrolactone, gamma-valerolactone, and delta-valerolactone.lactones and cyclic ketones.

It is preferred that the inventive antireflective coating composition is insoluble in photoresist casting solvents that include, but are not limited to: esters and ethers. Thus, the inventive antireflective coating composition can form a discrete underlayer immiscible with a photoresist layer. In other words, a layer of the inventive antireflective coating composition does not intermix with the above photoresist layer. By "insoluble" it is meant having a solubility of no more than 1 mg per milliliter in a solvent at room temperature. Examples of photoresist casting solvents include, but are not limited to: propylene glycol methyl ether acetate (PGMEA) and ethoxy ethyl propionate (EEP).

It is preferred that the inventive developable BARC composition has a refractive index (n) in the range from about 1.4 to about 2.2 and an absorption parameter (k) in the range from about 0.1 to about 1.0 at a wavelength of 248 nm, 193 nm, or other extreme ultraviolet radiation. In other words, the inventive developable BARC composition is highly absorbent to radiation in the deep and extreme UV region, and thereby is particularly suitable to be used as a BARC film with 193 nm photoresist compositions.

The present invention is further directed to a coating of the inventive antireflective coating composition. The inventive antireflective coating can be used between the substrate and the photoresist layer to reduce the problem of reflected radiation. Preferably, the inventive antireflective coating has a thickness ranging from about 10 nm to about 500 nm, with about 30 nm to about 200 nm more preferred.

In another aspect of the invention, the inventive antireflective coating composition may be used in a method of forming and transferring a relief image by photolithography.

In the inventive method, the inventive antireflective coating composition is first applied on a substrate by known means, such as spinning, casting, and dipping, to form an antireflective layer on the substrate. The substrate may be a semiconducting material, a dielectric material, a conductive material, or any combinations thereof, including multilayers. The substrate with the antireflective layer may then be baked (post applying bake) to remove any solvent from the inventive antireflective coating composition and improve the coherence of the antireflective layer. Typical post applying bake temperatures are about 90° to about 150° C., and typical post applying bake times are about 60 to about 90 seconds.

A positive photoresist composition (positive, negative, or hybrid) is then applied over the antireflective layer by known means to form a photoresist layer on the material. The substrate with the photoresist layer may then be baked (post applying bake) to remove any solvent from the photoresist composition and improve the coherence of the photoresist layer. A typical resist PAB temperature is within a range from about 90° to about 130° C. Typical photoresist thickness is from about 50 to about 300 nm. Any suitable positive resist composition may be used, such as the resist composition disclosed in U.S. Pat. Nos. 6,806,026 B2, 6,770,419 B2, and U.S. patent application Ser. No. 10/753,989, filed Jan. 8, 2004, the disclosures of which are incorporated herein by reference.

Next, the substrate is exposed to an appropriate radiation source through a patterned mask to form a latent image. In one exemplary embodiment, the imaging radiation is 193 nm radiation. In another embodiment, the imaging radiation is 248 nm radiation. The exposed substrate may then be baked (post-exposure bake) to promote the chemical reaction in the photoresist and to improve the coherence of the photoresist and coating layers. Typical post-exposure bake temperatures are about 90° to about 130° C., and typical post-exposure bake times are from about 60 to about 90 seconds.

The latent image is then developed to form a relief image pattern in the photoresist layer and the antireflective layer in a single step. That is, the exposed substrate is contacted with an aqueous base developer, such as 0.263 N tetramethyl ammonium hydroxide (TMAH), thereby removing the exposed portions of the photoresist layer and the exposed portions of the antireflective layer from the substrate in one step. Contact with a conventional developer forms a patterned photoresist layer and a patterned antireflective layer on the substrate. Unlike the prior art methods employing a separate plasma etching process to remove BARC materials, the present invention eliminates the extra step by removing the exposed portions of the photoresist and the exposed portions of the inventive antireflective coating composition in one step using an aqueous alkaline developer. Thus, the use of the inventive antireflective coating composition not only reduces processing cost and operational complexity in photolithography, but also avoids damages to the photoresist as well as the substrate caused by a plasma etching process. Furthermore, there is no photoresist/BARC etch rate matching issue in the present invention thereby allowing a wide range of photoresists to be used for the patterning process.

The relief image pattern in the photoresist layer and the antireflective layer may then be transferred to the substrate by removing portions of the substrate not covered by the patterned antireflective layer. Typically, portions of the substrate are removed by reactive ion etching or some other etching technique known to one skilled in the art.

The following examples are provided to illustrate the inventive antireflective coating composition and some advantages in using the same.

EXAMPLE 1

Synthesis of Poly(maleimide-co-5-methacryloyloxy-2,6-norbomanecarbo-γ-lactone-co-hyroxystyrene) (P1)

0.246 g (0.0015 mol) of 2,2'-azobisisobutyronitrile (AIBN) was added to a solution of 0.485 g (0.005 mol) of maleimide, 5.55 g (0.025 mol) of 5-methacryloyloxy-2,6-norbomanecarbo-γ-lactone and 2.40 g of hydroxystyrene monomer glyeme solution (0.020 mol) and 0.101 g( 0.0050 mole) of dodecanethiol in 23 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 250 ml of hexane with rigorous stirring. The resulting white solid was collected by filtration, washed with several portions of hexane, and dried under vacuum at 60° C. for 20 hr.

EXAMPLE 2

Synthesis of Poly(maleimide-co-gamma-butyrolactonemethacrylate-co-hyroxystyrene) (P2)

0.320 g (0.0019 mol) of 2,2'-azobisisobutyronitrile (AIBN) was added to a solution of 0.640 g (0.0066 mol) of maleimide, 6.80 g (0.0400 mol) of gamma-butrolactnoemethacrylate and 7.00 g of hydroxystyrene monomer glyeme solution (0.0006 mol) and 0.130 g (0.0066 mole) of dodecanethiol in 35 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 400 ml of heptane with rigorous stirring. The resulting white solid was collected by filtration, washed with several portions of hexane, and dried under vacuum at 60° C. for 20 hr.

EXAMPLE 3

Synthesis of Poly(maleimide-co-gamma-butyrolactonemethacrylate-co-hyroxystyrene) (P3)

0.246 g (0.0015 mol) of 2,2'-azobisisobutyronitrile (AIBN) was added to a solution of 0.485 g (0.0050 mol) of maleimide, 4.67 g (0.0275 mol) of gamma butrolactnoemethacrylate and 7.00 g of hydroxystyrene monomer glyeme solution (0.0175 mol) and 0.101 g (0.0050 mole) of dodecanethiol in 25 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 250 ml of methanol with rigorous stirring. The resulting white solid was collected by filtration, washed with several portions of hexane, and dried under vacuum at 60° C. for 20 hr.

EXAMPLE 4

Synthesis of Poly(maleimide-co-5-methacryloyloxy-2,6-norbomanecarbo-γ-lactone-co-hyroxystyrene) (P4)

0.246 g (0.0015 mol) of 2,2'-azobisisobutyronitrile (AIBN) was added to a solution of 0.485 g (0.005 mol) of maleimide, 6.105 g (0.0275 mol) of 5-methacryloyloxy-2,6-norbomanecarbo-γ-lactone and 7.00 g of hydroxystyrene monomer glyeme solution (0.0175 mol) and 0.101 g (0.0050 mole) of dodecanethiol in 25 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 250 ml of 50:50 PMA and heptane with rigorous stirring. The resulting white solid was collected by filtration, washed with several portions of hexane, and dried under vacuum at 60° C. for 20 hr.

EXAMPLE 5

Synthesis of Poly(maleimide-co-5-methacryloyloxy-2,6-norbomanecarbo-γ-lactone-co-hyroxystyrene) (P5)

0.246 g (0.0015 mol) of 2,2'-azobisisobutyronitrile (AIBN) was added to a solution of 0.485 g (0.005 mol) of maleimide, 4.99 g (0.0225 mol) of 5-methacryloyloxy-2,6-norbomanecarbo-γ-lactone and 9.00 g of hydroxystyrene monomer glyeme solution (0.0225 mol) and 0.101 g (0.0050 mole) of dodecanethiol in 25 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 250 ml of 25:75 PMA and heptane with rigorous stirring. The resulting white solid was collected by filtration, washed with several portions of hexane, and dried under vacuum at 60° C. for 20 hr.

EXAMPLE 6

Synthesis of Poly(N-Methylmaleimide-co-gamma Butryolactonemethacrylate-co-hyroxystyrene) (P6)

0.320 g (0.0019 mol) of 2,2'-azobisisobutyronitrile (AIBN) was added to a solution of 0.740 g (0.0066 mol) of N-methylmaleimide, 6.80 g (0.0400 mol) of gamma-butrolactonemethacrylate and 7.00 g of hydroxystyrene monomer glyeme solution (0.0200 mol) and 0.130 g (0.0006 mole) of dodecanethiol in 40 g of 2-butanone. The solution was deoxygenated by bubbling dry $N_2$ gas through the solution for 0.5 hr and then the solution was allowed to reflux for 12 hr. The reaction mixture of the solution was cooled to room temperature and precipitated in 250 ml of heptane with rigorous stirring. The resulting white solid was collected by filtration, washed with several portions of hexane, and dried under vacuum at 60° C. for 20 hr.

EXAMPLE 7

PGMEA-resistance Test

For the purpose of evaluating the PGMEA-resistance of the inventive antireflective coating composition, two exemplifying coatings, i.e., C1 and C2, were prepared. C1 consisted of polymer P1 (Example 1), while C2 consisted of P1 and 10% (by weight) of di(4-t-tutylphenyl)iodonium camphorsulfonate. That is, C1 is an embodiment of the inventive antireflective coating composition without the at least one photo sensitive additive, and C2 is an embodiment of the inventive antireflective coating composition with the at least one photo sensitive additive. C1 and C2 were separately applied to two substrates to form BARC films and baked at 120° C. for 60 seconds. The thickness of each BARC films was then measured. Next, the BARC films were rinsed with PGMEA for 15 seconds and then baked at 110° C. for 60 seconds. The thickness of each BARC films was then measured.

As indicated in Table 1, there is little change in thickness before and after PGMEA rinse demonstrating PGMEA-resistance of the inventive antireflective coating composition.

TABLE 1

| Coating | Thickness before Rinse (Å) | Thickness after Rinse (Å) |
| --- | --- | --- |
| C1 | 855 | 853 |
| C2 | 918 | 911 |

EXAMPLE 8

Lithographic evaluation

For the purpose of evaluative lithographic experiments, a BARC formulation containing P1 (Example 1) was prepared by dissolving 0.2 g of the polymer in 9.8 g of cyclopentanone. The prepared BARC formulation was spin-coated for 30 seconds onto a silicon wafer. The BARC layer was then baked at 150° C. for 60 seconds on a vacuum hot plate to produce a film thickness of about 600 Å. Next, a 193 nm single layer resist (as described in U.S. patent application Ser. No. 10/753,989, filed Jan. 8, 2004) was spin-coated for 30 seconds onto the BARC material layer. The photoresist layer was soft-baked at 110° C. for 60 seconds on a vacuum hot plate to produce a film thickness of about 2400 Å. The wafers were then exposed to 193 nm radiation (ASML scanner, 0.75 NA). The exposure pattern was an array of lines and spaces of varying dimensions down to 80 nm. The exposed wafers were post-exposure baked on a vacuum hot plate at 110° C. for 90 seconds. The wafers were then puddle developed using 0.263 N TMAH developer for 60 seconds. The resulting patterns of the photoresist imaging layer were then examined by scanning electron microscopy (SEM). Patterns of line/space pairs of 90 nm and above were readily distinguished and appeared sharply defined with clean profiles and without standing wave.

Figure 1A:
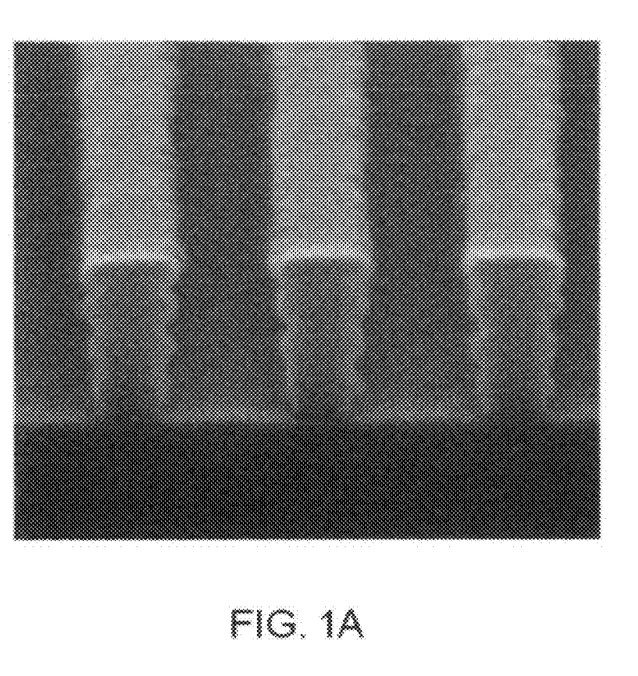
FIGS. 1A and 1B are scanning electron micrographs showing partial sectional views of photoresist lines and spaces after processing without and with the inventive antireflective coating composition.
Figure 1B:
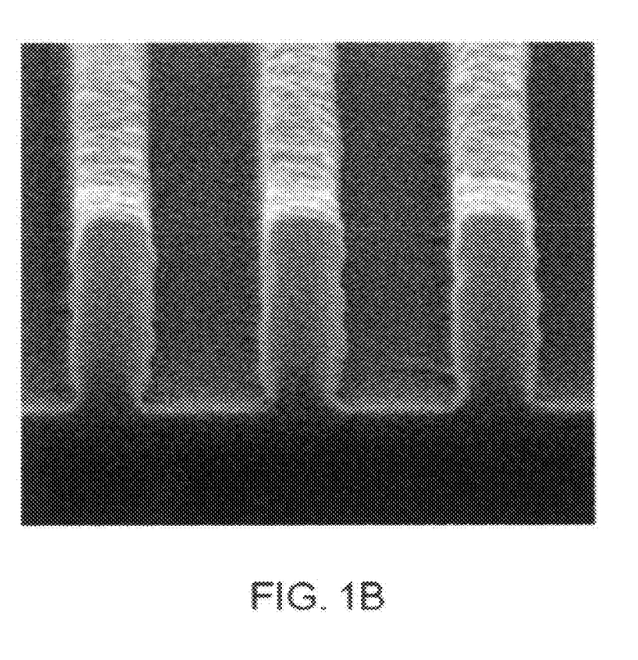

FIG. 1A is a partial sectional view of a patterned 193 nm resist on HMDS treated Si wafer without a BARC, which shows slope profiles and severe standing waves. In contrast, FIG. 1B is a partial sectional view of the same resist on a coating of the inventive antireflective composition which shows clean profiles without any standing waves or line collapse.

EXAMPLE 9

Lithographic evaluation

For the purpose of evaluative lithographic experiments, a BARC formulation containing P1 (Example 1) and di(4-t-tutylphenyl)iodonium camphorsulfonate was prepared by dissolving 0.2 g of the polymer and 0.01 g of di(4-t-tutylphenyl)iodonium camphorsulfonate in 9.8 g of cyclopentanone. The prepared BARC formulation was spin-coated for 30 seconds onto a silicon wafer. The BARC layer was then baked at 150° C. for 60 seconds on a vacuum hot plate to produce a film thickness of about 600 Å. Next, a 193 nm single layer resist (as described in U.S. patent application Ser. No. 10/753,989, filed Jan. 8, 2004) was spin-coated for 30 seconds onto the BARC material layer. The photoresist layer was soft-baked at 110° C. for 60 seconds on a vacuum hot plate to produce a film thickness of about 2400 Å. The wafers were then exposed to 193 nm radiation (ASML scanner, 0.75 NA). The exposure pattern was an array of lines and spaces of varying dimensions down to 80 nm. The exposed wafers were post-exposure baked on a vacuum hot plate at 110° C. for 90 seconds. The wafers were then puddle developed using 0.263 N TMAH developer for 60 seconds. The resulting patterns of the photoresist imaging layer were then examined by scanning electron microscopy (SEM). Patterns of line/space pairs of 90 nm and above were readily distinguished and appeared sharply defined with clean profiles and without standing wave.

While the present invention has been particularly shown and described with respect to preferred embodiments thereof, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

Having thus described our invention in detail, what we claim as new and desire to secure by the Letters Patent is:

1. A method of forming and transferring a relief image by photolithography, said method comprising:
applying, to a substrate, a layer of an antireflective coating composition to form an antireflective layer, said antireflective coating composition is developable in an aqueous alkaline developer and comprises a polymer, said polymer does not comprise an acid labile group and is selected from the group consisting of:

(XIII)

(XIV)

(XV)

(XVI)

(XVII)

wherein x, y, and z are the same or differently, and are independently an integer of 5-500; baking the antireflective layer at temperature of about 90° C. to about 150° C.;

applying a layer of a positive photoresist composition over the antireflective layer to form a photoresist layer;

pattern-wise exposing the photoresist layer and the antireflective layer to an imaging radiation to form a latent image;

contacting the photoresist layer and the antireflective layer with the aqueous alkaline developer, wherein the exposed portions of the photoresist layer and the exposed portions of the antirefleetive layer are removed in a single step to form a patterned photoresist layer and a patterned antireflective layer having a relief image pattern therein; and transferring the relief image pattern in the patterned photoresist layer and the patterned antireflective layer to the substrate.

* * * * *